Feb. 22, 1966 A. LEGER, JR 3,237,018

INTEGRATED SEMICONDUCTOR SWITCH

Filed July 9, 1962

*INVENTOR.*
ALTON LEGER, JR.

*BY* Arthur H. Swanson

ATTORNEY.

3,237,018
INTEGRATED SEMICONDUCTOR SWITCH

Alton Leger, Jr., Roslyn, Pa., assignor to Honeywell Inc., a corporation of Delaware Filed July 9, 1962, Ser. No. 208,222
2 Claims. (Cl. 307—88.5)

This invention relates to semiconductive signal devices. More particularly, the present invention pertains to semiconductor switching devices.

An object of the present invention is to provide an improved multi-electrode semiconductor switching device.

Another object of the present invention is to provide an improved semiconductor switching device which is characterized by a switching operation for low amplitude signal levels.

A further object of the present invention is to provide an improved semiconductor switching device which is also characterized by an elimination of internal interaction between an input signal and a switch driving signal.

A still further object of the present invention is to provide an improved semiconductor switching device, as set forth herein, which is characterized by a simplicity of operation and construction.

In accomplishing these and other objects, there has been provided, in accordance with the present invention, a semiconductor switching device comprising a slab of p-type material which is joined to a slab of n-type material to form a p-n junction. Axially aligned electrical contacts are made to respective ones of these slabs. Two areas of p-type material are introduced into the n-type slab of material on respective sides of the electrical contact made to the n-type slab and spaced substantially the same distance from that contact. Separate electrical contacts are made to the p-type areas to provide an electrical signal path to the p-type areas.

A better understanding of the present invention may be had from the following detailed description when read in connection with the accompanying drawings, in which.

Figure 1:
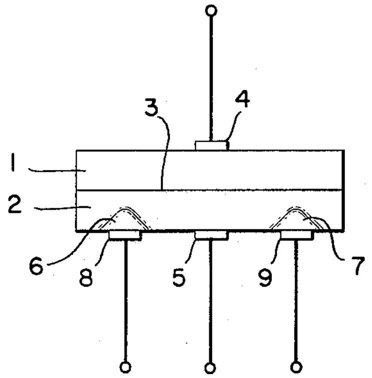
FIG. 1 is a pictorial representation of a semiconductor switch structure embodying the present invention.

Referring now to FIG. 1, there is shown a semiconductor switching device comprising a slab of semiconductive material 1 which may be of a p-type material. A second slab of semiconductive material 2 of an n-type material is joined to the first slab 1 to form a p-n junction 3. An ohmic, or direct, electrical connection is made to the first slab 1 by contact 4 using any suitable prior art technique. A direct contact 5 is similarly provided for the second slab 2. The first and second contacts 4 and 5 are arranged to be substantially in axial alignment to define a current path through the semiconductor material slabs 1 and 2 across the p-n junction 3.

A first area 6 of the second slab 2 is doped by any suitable manufacturing technique to form a region of p-type material. A second area 7 of p-type material is similarly formed in the second slab 2. The second area 7 is arranged on the opposite side of the contact 5 from the first area 6. Further, the areas 6 and 7 are spaced substantially the same distance from the contact 5. An electrical contact 8 is provided for the first area 6, and an electrical contact 9 is similarly attached to the second area 7.

Figure 2:
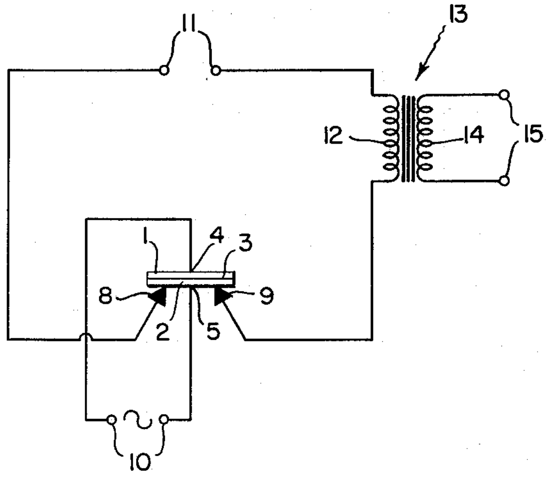
FIG. 2 is a schematic illustration of a switching circuit using the switch structure shown in FIG. 1.

As shown in FIG. 2, the semiconductor switch of the present invention is connected to apply an alternating current driving signal to the contacts 4 and 5. Thus, a pair of terminals 10 are provided for connection to the alternating current source, and the contacts 4 and 5 are connected to respective ones of the terminals 10. A pair of input terminals 11 are provided for connection to a source of a unidirectional input signal to be switched, or chopped, by the switching device of the present invention. The contact 8 is connected to one of the input terminals 11. The other one of the input terminals 11 is connected to one side of the primary winding 12 of an output transformer 13. The other side of the primary winding 12 is connected to the contact 9. A secondary winding 14 of the transformer 13 is connected to apply a signal appearing thereacross to a pair of output terminals 15.

In operation, the switching device of the present invention is effective to provide a conductive path between the contacts 8 and 9 in response to a driving signal applied to the contacts 4 and 5 by the alternating current source connected to the terminals 10. Assume the signal applied to the contacts 4 and 5 is effective to make contact 4 positive with respect to contact 5. This signal polarity will be effective to make the p-type semiconductor slab positive with respect to the n-type semiconductor slab region. This polarity is effective to introduce minority carriers into the second slab 2 in the vicinity of areas 6 and 7. The presence of these carriers in the second slab 2 will be effective to reduce the electrical signal impedance of the path between contacts 8 and 9 according to well-known semiconductor theory. A signal now applied to one of the contacts 8 and 9 from the input terminals 11 will pass through the second slab 2 to the other of the contacts 8 and 9 and appear across the primary winding 12. It may be seen that this conduction is essentially an ohmic conduction of very low resistance which allows a low-loss operation for a low magnitude unidirectional input signal. Additionally, since the signal effects of the driving signal and input signal are substantially at right angles, the internal interaction between these signals is eliminated.

Assume the alternating current signal applied to contacts 4 and 5 is reversed in polarity to make contact 4 negative with respect to contact 5. With this polarity across the p-n junction 3, the minority carriers are substantially removed from the second slab 2. The removal of these carriers from the second slab 2 is effective to create a high impedance path between the contacts 8 and 9. This high impedance is effective to prevent an input signal from the terminals 11 from appearing across the primary winding 12. Thus, the alternating current signal applied to the contacts 4 and 5 is effective to control the input signal at the terminals 11. As a result of this controlling action, the output signal at the terminals 15 is an alternating, or chopped, signal having an amplitude corresponding to the input signal applied to the input terminals 11. It is to be noted that the switching device of the present invention may be made with the opposite conductivity type material than those described.

Thus, it may be seen that there has been provided, in accordance with the present invention, a semiconductor switching device characterized by the ability to switch low magnitude signals and an elimination of signal interaction between the switching signal and the input signal.

What is claimed is:

1. A semiconductor switch comprising a semiconductor body including first and second regions of opposite conductivity type separated by a p-n junction, a first ohmic contact on said first region, a second ohmic contact on said second region, said first and second contacts are separated by the combined thickness of said first and second region and said p-n junction and are substantially coaxial, first and second zones located in said second region and each being of opposite conductivity type to that of said second region, discrete ohmic contacts on said first and second zones, respectively, first biasing means connected to said discrete ohmic contacts and applying an input signal thereto to create a first current path solely within said second region between said discrete ohmic contacts, and second biasing means connected across said first and second ohmic contacts to create a second current path across said p-n junction between said first and second ohmic contacts to intersect substantially at right angles said first current path to switch the impedance of said first current path between high and low impedance states by changing the bias across said p-n junction.

2. A semiconductor switch as set forth in claim 1 wherein said first and second zones are on opposite sides of said second ohmic contact and spaced substantially the same distance therefrom.

References Cited by the Examiner

UNITED STATES PATENTS

| | | | |
|---|---|---|---|
| 2,754,431 | 7/1956 | Johnson | 317—234 |
| 2,779,877 | 1/1957 | Lehovec | 317—235 |
| 2,910,634 | 10/1959 | Rutz | 317—235 |
| 3,010,033 | 11/1961 | Noyce | 317—235 |

FOREIGN PATENTS

| | | |
|---|---|---|
| 199,909 | 10/1958 | Austria. |

JOHN W. HUCKERT, *Primary Examiner.*

ARTHUR GAUSS, DAVID J. GALVIN, *Examiners.*

Disclaimer

3,237,018.—*Alton Leger, Jr.*, Roslyn, Pa. INTEGRATED SEMICONDUCTOR SWITCH. Patent dated Feb. 22, 1966. Disclaimer filed Aug. 5, 1968, by the assignee, *Honeywell Inc.*

Hereby enters this disclaimer to claims 1 and 2 of said patent.

[*Official Gazette January 7, 1969.*]